United States Patent [19]

Potember et al.

[11] Patent Number: 4,825,408
[45] Date of Patent: Apr. 25, 1989

[54] MULTISTATE OPTICAL SWITCHING AND MEMORY APPARATUS USING AN AMPHOTERIC ORGANIC CHARGE TRANSFER MATERIAL

[75] Inventors: Richard S. Potember, Catonsville; Theodore O. Poehler, Baltimore, both of Md.

[73] Assignee: The Johns Hopkins University, Baltimore, Md.

[21] Appl. No.: 35,327

[22] Filed: Apr. 7, 1987

Related U.S. Application Data

[62] Division of Ser. No. 603,717, Apr. 25, 1984, Pat. No. 4,663,270.

[51] Int. Cl.$^4$ .............. G11C 13/00; G11B 3/70; G03C 1/00; G03C 3/00
[52] U.S. Cl. .................. 365/113; 365/114; 365/118; 430/495
[58] Field of Search ............ 365/113, 114, 118; 430/495

[56] References Cited

U.S. PATENT DOCUMENTS

| | | | |
|---|---|---|---|
| 4,470,053 | 9/1984 | Maffitt et al. | 365/113 |
| 4,613,519 | 9/1986 | Yacobi | 365/113 |
| 4,647,944 | 3/1987 | Gravesteijn et al. | 365/113 |
| 4,663,270 | 5/1987 | Potember et al. | 430/495 |
| 4,719,594 | 1/1988 | Young et al. | 365/113 |

Primary Examiner—Mukund J. Shah
Attorney, Agent, or Firm—Robert E. Archibald; Mary Louise Beall

[57] ABSTRACT

The charge transfer apparatus of the present invention comprises an optical storage medium of either a mixture of several charge transfer compounds of varying redox potential or a single amphoteric organic charge transfer compound capable of undergoing a multistage charge transfer reaction, and a source of optical energy, typically a laser. When the optical energy illuminates a spot on the optical storage medium, the spot switches to one of a plurality of optically detectable states.

75 Claims, 8 Drawing Sheets

| ORGANIC CHARGE TRANSFER MATERIAL | COLOR OF NEUTRAL ORGANIC ELECTRON ACCEPTOR MOIETY | COLOR OF ORGANIC SALT IN FIRST STATE | COLOR OF ORGANIC SALT IN SECOND STATE |
|---|---|---|---|
| Ag TCNQ | YELLOW | PURPLE | YELLOW-GREEN |
| Cu TCNQ | YELLOW | BLUE-BLACK | YELLOW |

$R_1 = -H, R_2 = -H$
$R_1 = -CH_3, R_2 = -H$
$R_1 = -OCH_3, R_2 = -H$
$R_1 = -F, R_2 = -F$

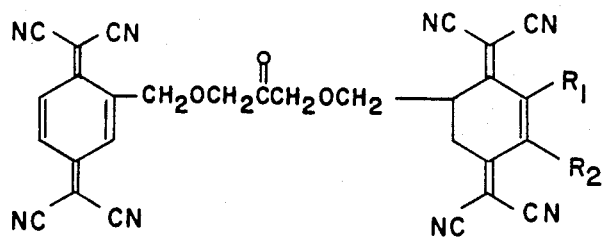
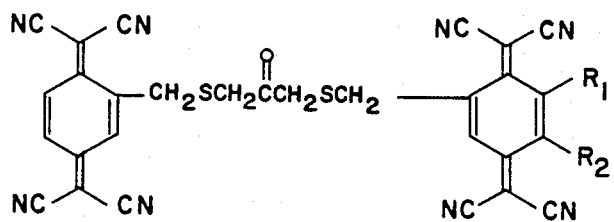
$R_1, R_2$ = -Cl, -Br, -F, -CH$_3$, -OMe, etc.
FIG. 7
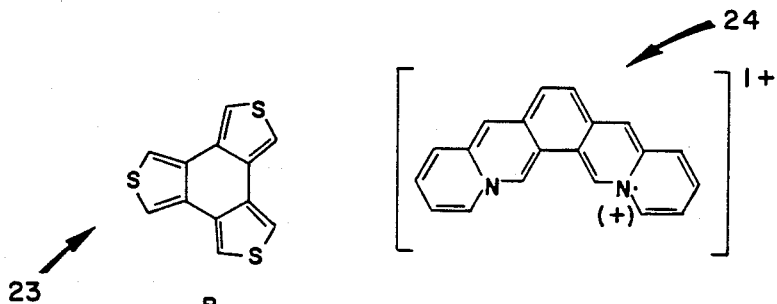
FIG. 9
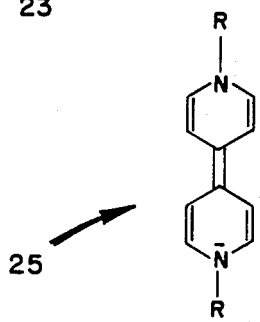
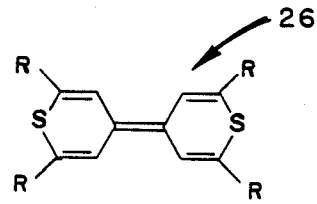
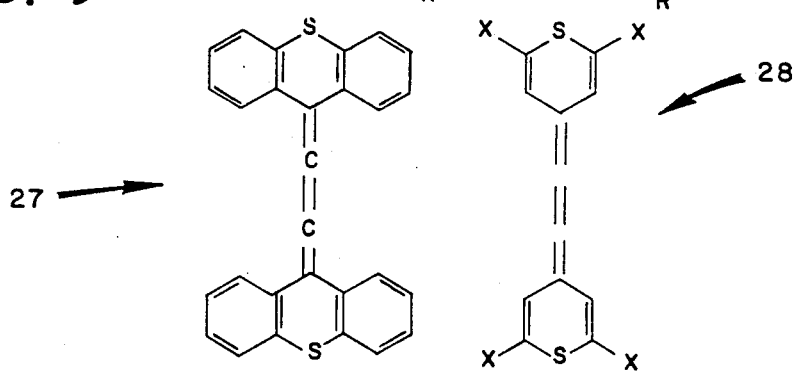

MULTISTATE OPTICAL SWITCHING AND MEMORY APPARATUS USING AN AMPHOTERIC ORGANIC CHARGE TRANSFER MATERIAL

STATEMENT OF GOVERNMENTAL INTEREST

The Government has rights in this invention pursuant to Contract No. N00024-83-C-5301 awarded by the Department of the Navy.

CROSS REFERENCE TO RELATED APPLICATION

The present application is a divisional application of Ser. No. 603,717, filed Apr. 25, 1984, now U.S. Pat. No. 4,663,270.

BACKGROUND AND/OR ENVIRONMENT OF THE INVENTION

1. Field of the Invention

The present invention pertains generally to the use of a mixture of several charge transfer compounds of varying redox potential or the use of a single amphoteric organic charge transfer compound to produce optical devices and more particularly to the use of these organic charge transfer materials as a memory medium and switching mechanism for an optical system.

2. Description of the Contemporary and/or Prior Art

With the advent of the information revolution, recent research activities have focused on developing optical storage systems and optoelectronic switches. The interaction of laser light with matter has been intensely investigated because of its use in optical memory systems. Potentially, optical recording can produce information storage densities in excess of 100 million bits per square centimeter. Currently many optical memory devices rely on crystalline phase transitions (J. Stuke, *Journal of Non-Crystalline Solids,* Vol. 4, (1970)) or on photochemical hole burning (PHB) in which a laser pits the material in an effort to store data. An article entitled "Laser Marking of a Thin Organic Film" by J. J. Wrobel et al, *Applied Physics Letter* 40, (11) June 1, 1982, describes such a technique using a laser beam to burn holes in a thin organic film. Similarly, optical writing on blue sputtered iridium oxide films is reported by Mabosch et al in *Applied Physics Letter* 41 (1), July 1, 1982. This technique uses an optical writing mechanism to thermally induce dehydration at temperatures below the melting point of the optical medium. An article entitled "Light-induced Phenomena in Dye-polymer Systems" by V. Novotny et al, *The Journal of Applied Physics* 50 (3), March 1979, describes an optical marking process based on diffusion in a dye-polymer system.

The prior art optical storage systems have one overriding disadvantage—prior art optical medium is not erasable. As a result, optical storage technology has found little application in computer technology, which requires both read, write and erase functions.

U.S. Pat. No. 4,371,883 (entitled "Current Controlled Bistate Electrical Organic Thin Film Switching Device (TCNQ)", filed March 14, 1980) and U.S. Pat. No. 4,507,172 (entitled "Method of Fabricating a Current Controlled Bistate Electrical Organic Thin Film Switching Device (TCNQ)", filed June 7, 1982, by Richard S. Potember, Theodore O. Poehler and Dwaine O. Cowan, disclose a class of organic charge transfer salts, such as CuTCNQ, which exhibit stable and reproducible bistate switching between an equilibrium, or first state, and a second state, in the presence of an applied electrical field. These references disclose that certain organic charge transfer salts will undergo a bistate reversible electrochemical topotactic redox reaction in the presence of an applied electric field. The electrical field causes the organic salt to switch from a first state to a second (i.e., bistate switching). A detectable impedance change occurs between the equilibrium, or first state, and the second state thereby allowing one to determine if a particular area is in the first or second state. In specific, an electrical field is applied across a thin film of CuTCNQ, or an equivalent organic charge transfer salt. When the applied electrical field exceeds a threshold value the impedance across the thin organic film will drop from a relatively high impedance to a relatively low impedance.

Two papers written by Richard S. Potember et al report that when the organic film is electrically switched, the second state has different optical properties from the equilibrium or first state: (1) "The Vibrational and X-ray Photoelectron Spectra of Semiconducting Copper-TCNQ Films" *Chemica Scripta,* Vol. 17, 219-221 (1981); and (2) "Electrical Switching and Memory Phenomena in Semiconducting Organic Thin Films" *American Chemical Society Symposium Series* No. 184 (1982). These articles describe infrared spectroscopic means and reference well known Raman spectroscopic techniques (S. Matsuzaki et al, "Raman Spectra of Conducting TCNQ Salts" *Solid State Communications,* Vol. 33, pp. 403–405, 1980) for determining if the CuTCNQ film, switched by an AC or DC electric field is in the first or second state. Follow-up work reported by E. I. Kamitsos et al used Raman spectroscopic techniques to verify the electrochemical charge transfer equation described in the above-referenced articles which causes the CuTCNQ salt to switch from the first to second state: "Raman Study of the Mechanism of Electrical Switching in CuTCNQ films" *Solid State Communications,* Vol. 42, No. 8, pp. 561–565 (1982). These papers point out that spectroscopic means can be used to discern whether an area of CuTCNQ switch sed by an applied electrical field is in the first or second state.

Potember and Poehler, the present inventors, with Benson, are inventors of "Optical Storage and Switching Devices Using Organic Charge Transfer Salts", U.S. Pat. No. 4,574,366, filed Feb. 7, 1983, which is directed to a bistate optical switching device. They discovered that certain organic charge transfer salts will also experience two-state switching when exposed to optical radiation. It was discovered that when the optical radiation exceeds a certain threshold, the organic charge transfer salt switched from a first to a second state. Spectroscopic and other optical means are used to determine if a portion of the organic charge transfer material was in the first, equilibrium, or second switched state. This patent describes certain optical devices used to store binary information—the first state can be represented by a "0", and the second or switched state can be represented by a "1". The patent also describes certain optical and thermal means for switching the organic material from the switched state ("1" state) back to the equilibrium state ("0" state). However, the organic optical devices described are two-state systems which can only store two bits of information on a particular area of the organic optical storage medium.

SUMMARY OF THE INVENTION

The present inventors have improved the organic charge transfer switching system described in U.S. Pat. No. 4,574,366 and have developed an organic storage medium which can optically store three or more bits of information at the same spot on the storage medium. The inventors have discovered that some amphoteric organic charge transfer materials can undergo multistate electron transfer reactions which enable the optical storage material to be switched among a plurality of states. The inventors have further discovered that each state can be uniquely identified by spectroscopic means and that energy from optical, infrared or thermal sources can be used to erase the storage medium and return it to its first or base state.

The invented apparatus comprises: (1) an optical storage medium, generally in the form of a film of either a mixture of several charge transfer compounds of varying redox potential or of a single amphoteric organic charge transfer compound which is capable of undergoing a multistage charge transfer reaction; and (2) a source of applied optical energy which illuminates a spot on the optical storage medium and causes that spot to switch to one of a plurality of states. The organic material will switch from one state to another state as the applied optical field strength is increased.

The inventors have discovered that at particular optical field strengths, the amphoteric medium will switch into a particular state. The inventors have also discovered that each state of said multistate electron transfer reaction, can be identified by the presence of a unique set of redox species. Change in the electronic or fundamental absorption modes are used to "read" the state of a "data storage spot" (i.e., each spot to be illuminated by the optical beam ) on the optical storage medium by identifying the particular set of redox species present.

For example, with an amphoteric organic charge transfer material having a 4-state electron transfer reaction, an optical "write" beam can be used to switch the optical storage medium from the base state to one of three states, depending on the intensity of the optical field strength. Therefore, the optical "write" beam could be used to store multiple bits of data at each "data storage spot". Similarly, optical and spectroscopic means can "read" the multiple bits of data stored at any "data storage spot" on the film. By appropriately placing the "data storage spots" on the optical storage medium, a conventional two dimensional configuration can be used to make an extremely dense optical storage device.

The inventors also discovered that thermal energy (generated by an optical or thermal means) can be used to "erase" all or part of the optical storage film and return each state of the multiple storage spot to its base or equilibrium state. The reverse multistage charge transfer reaction is a thermally activated process. It was also discovered that different organic charge transfer materials can be selected to produce either threshold or memory optical switching.

The invented optical storage medium generally consists of a thin film of an amphoteric organic charge transfer material. The amphoteric organic charge transfer material is capable of undergoing a multistage charge transfer reaction. Each state of said charge transfer reaction electrochemically generates multiple redox species. Each state can be identified by observing the unique set of redox species generated. The amphoteric organic charge transfer material can be fabricated in several ways, which will be described in detail later in this specification. First, an amphoteric mixture can be produced by growing thin films containing a mixture of two different radical ion salts. Each radial ion salt, such as CuTCNQ or CuTCNQ (i-Pr)$_2$, exhibits separate bistate switching reactions. Secondly, an amphoteric molecule can be complexed by chemically linking various acceptor molecules (such as TCNQ, TNAP, or TCNQ (i-Pr)$_2$ together through sigma and pi bonding systems. Third, highly delocalized radical ion acceptor molecules can be synthesized which exhibit the optical switching and amphoteric properties.

An object of the present invention is to use the amphoteric charge transfer material to produce a multistate optical storage device. An optical "write" beam is controlled to illuminate at least one "data storage spot" on the amphoteric film. The level of the applied electromagnetic field of the optical "write" beam is adjusted so that the illuminated "data storage spot" can be switched to a particular one of a plurality of states. Data from a "data storage spot" can be subsequently "read" by determining the optical characteristics of that "data storage spot" through spectroscopic techniques. The stored data can be "erased" by applying thermal energy to a particular part of the amphoteric organic charge transfer film, thereby returning that portion of the film to its base or equilibrium state.

It is a second object of the present invention to provide an optical medium which can be optically switched from an equilibrium state to two or more switched states (redox states). The level of the electromagnetic field at optical frequencies determines into which state the optical medium is switched. Further, the particular switched state can be subsequently identified by observing the changes in the electronic optical spectrum or the change in the fundamental absorption modes.

The third object of the present invention is to produce an amphoteric organic charge transfer medium which undergoes a multistage charge transfer reaction when subjected to an applied electric field. Electromagnetic energy at optical frequencies causes the material to undergo successive states of a redox reaction as the optical field strength is increased. This stepwise switching allows an optical beam to switch the amphoteric organic charge transfer material from one stable oxidation state to a second, third, or fourth stable state. Each state can be identified by observing the optical characteristics of the redox species associated with that particular switched state. The amphoteric organic charge transfer material is "erasable" by applying thermal energy, which reverses the reaction and returns the material to its equilibrium state. Different amphoteric organic charge transfer materials can be selected to provide either memory or threshold multistate switching.

While several features of the present invention relate to optical storage medium and optical memory devices, it is to be understood that the above-mentioned multistate switching function of the amphoteric organic charge transfer material can have application in other optical devices and optically sensitive apparatus. The above-mentioned objectives, as well as other objectives and advantages of the present invention, will become readily apparent after reading the ensuing description of several non-limiting illustrative embodiments and viewing the accompanying drawings.

BRIEF DESCRIPTION OF THE DRAWINGS

In order that the present invention may be more fully understood, it will now be described, by way of example, with reference to the following drawings in which:

FIG. 1a shows the spectral bands for neutral TCNQ; FIG. 1b shows the spectral bands for CuTCNQ in the first state; FIG. 1c shows the spectral bands for CuTCNQ in the switched state;

FIG. 2a shows the optical characteristics of the base state; FIG. 2b shows the optical characteristics of the second state; FIG. 2c shows the optical characteristics of the third state;

FIG. 7 shows several examples of two chemically linked radical ion acceptor molecules which exhibit multistate optical switching;

FIG. 9 shows several highly delocalized radical ion donor molecules which exhibit multistate switching as taught by the present invention;

DETAILED DESCRIPTION OF THE PREFERRED EMBODIMENT

To understand multistate switching it is necessary to understand some of the principles of bistate optical switching as described in the above-mentioned U.S. patent entitled "Optical Storage and Switching Devices Using Optical Charge Transfer Salts" (U.S. Pat. No. 4,574,366) which is incorporated herein by reference. The basic electrochemical redox reaction which occurs when a bistable organic charge transfer salt, such as CuTCNQ, is illuminated with a beam having sufficient optical field strength and switched from a first to a second state, is shown below:

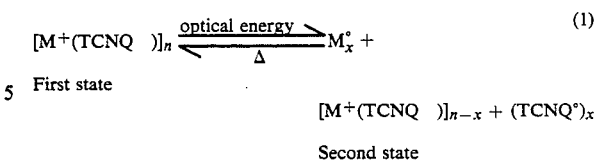

It is believed that switching occurs because the optical beam (i.e., an electromagnetic field at optical frequencies) causes the bonds between the organic electron acceptor (in this case TCNQ) and the donor (represented by M) to break, allowing a charge to transfer from the donor to the organic electron acceptor. The foregoing Equation (1) clearly shows a change in charge distribution as the organic salt switches from a first to a second state. In the first, or base state, the organic electron acceptor moiety is found almost exclusively in the (TCNQ$^-$). However, in the second, or switched state, the organic electron acceptor moiety is found in both its reduced (TCN-O$^-$) and neutral TCNQ$^\circ$) forms.

Figure 1A:
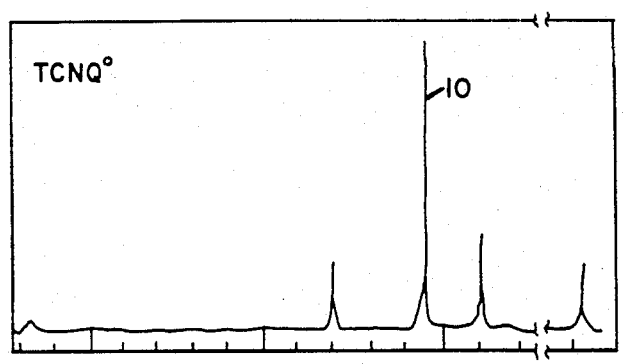
FIGS. 1a-1c are graphs of the Raman spectral bands for bistate CuTCNQ.
Figure 1B:
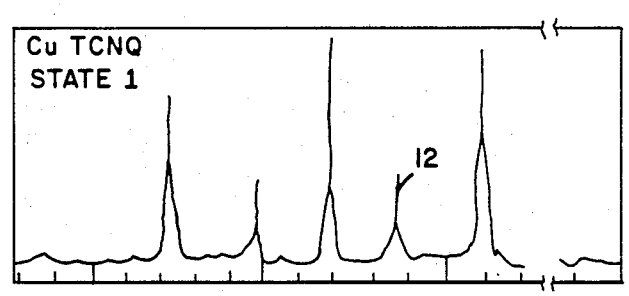
Figure 1C:
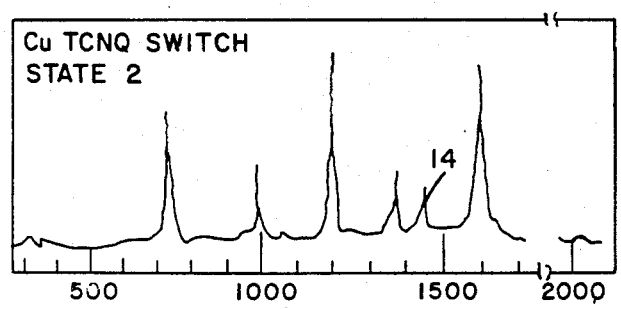

It will be noted from Equation (1) that each state is associated with a unique set of redox species. In the first state the acceptor moiety is found almost exclusively in the reduced form (e.g., only the TCNQ$^-$ species is present); whereas, in the switched, or second state, the acceptor moiety exists in both the reduced and neutral form (e.g., TCNQ$^-$ and TCNQ$^\circ$ redox species are present). Visual, spectroscopic, fluorescent and/or other optical means can be used to determine whether the bistate charge transfer salt is in the first or second state by identifying optical characteristics associated with each redox species. FIG. 1 shows the Raman spectral bands for the organic charge transfer salt CuTCNQ: FIG. 1a shows the spectral bands for neutral TCNQ (e.g., TCNQ$^\circ$); FIG. 1b shows the spectral bands for CuTCNQ in the first state where essentially all the organic electron acceptor moiety is in a reduced form (e.g., only the TCNO$^-$ redox species is present); FIG. 1c shows the spectral band for CuTCNQ in the second, or switched state, where the organic electron acceptor moiety is in both the reduced and neutral oxidation states (e.g., both the TCNQ$^-$ and TCNQ$^\circ$ species are present). The Raman spectral bands are fundamental absorption modes which are sensitive to the oxidation state of the organic electron acceptor moiety, thereby uniquely identifying the redox species present (i.e., in our example, determining if the TCNQ or TCNQ$^\circ$ redox species are present). When CuTCNQ is used as the organic charge transfer salt one need only analyze the 1451 cm$^{-1}$ spectral band to determine if the organic salt is in the first or second state. If the CuTCNQ organic charge transfer salt is in the first state, the spectral intensity is low at 1451 cm$^{-1}$; if the organic charge transfer salt is in the second state, the spectral intensity is high at 1451 cm$^{-1}$.

FABRICATING MULTISTATE AMPHOTERIC CHARGE TRANSFER MATERIAL FROM TWO OR MORE BISTATE ORGANIC CHARGE TRANSFER SALTS

The first method of fabricating a multistate amphoteric charge transfer material, as taught by the present invention, is to produce a polycrystalline mixture from two bistate organic charge transfer salts. Under this method a film is grown containing two different radical ion salts mixed in a predetermined ratio. For example, neutral TCNQ° and neutral TCNQ (i-Pr)$_2$ are added to a solvent such as CH$_3$CN to from a solution. The solution is allowed to interact with a copper metal foil and corresponding complexes of Cu$_2$[TCNQ:TCNQ(i-Pr)$_2$] are grown on the metal foil producing a polycrystalline film. (It is to be understood that it is also within the contemplation of the invention to use other known methods to produce the polycrystalline mixture).

When Cu$_2$[TCNQ:TCNQ(i-Pr)$_2$], an amphoteric charge transfer material, is irradiated by an optical source (such as an Argon ion laser) the optical characteristics of the material change with increases in the optical power density (watts/cm$^2$). Three different optical spectra were observed which correspond to three switched states. Three switched states were noted because the optical field strength required to switch CuTCNQ from its base state to its second state is higher than the optical energy necessary to switch CuTCNQ(i-Pr)$_2$. The Applicants were able to use such field strength dependence to stepwise switch each copper bistable salt from its base state to its switched state at a different optical field strength.

Figure 2A:
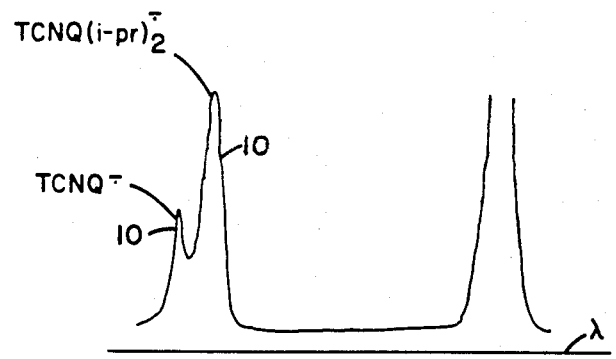
FIGS. 2a-2c are Raman spectrophotometric plots illustrating each of the three switched states of Cu[TCNQ (i-Pr)$_2$]
Figure 2B:
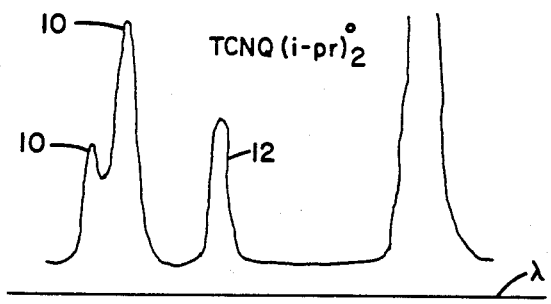

FIG. 2 is a Raman spectrophotometric plot illustrating each of the three states of Cu[TCNQ:TCNQ(i-Pr)$_2$]. FIG. 2a shows the optical characteristics of the unswitched or base state. In the base state, strong $\nu$4(C=C stretching) Raman bands 10 were observed for both copper TCNQ and copper TCNQ(i-Pr)$_2$. The copper TCNQ(i-Pr)$_2$ stretching frequency is at 1390 cm$^{-1}$ which is shifted approximately 15 cm$^{-1}$ from the copper TCNQ stretching band at 1375 cm$^{-1}$. The Raman bands 10 identify the presence of the TCNQ and TCNQ(i-Pr)$_2$ moieties in their reduced states (i.e., the TCNQ and TCNQ(i-Pr)$_2$ redox species are present). FIG. 2b shows the optical characteristics of the second state, which can be identified by the appearance of the Raman band 12 at 1451 cm$^{-1}$ which is associated with the presence of the neutral TCNQ(i-Pr)$_2$° redox species. To switch from the base state (illustrated in FIG. 2a) to the second state (illustrated in FIG. 2b) an optical field strength had been applied to the film which was sufficient to switch the TCNQ(i-Pr)$_2$ from its reduced species to its neutral species. However, the optical field strength was not sufficient to switch the TCNQ molecules. The second state can be identified by the presence of a new spectral peak at 1451 cm$^{-1}$ (element 12, FIG. 2b) corresponding to neutral TCNQ(i-Pr)$_2$° species and a decrease in the intensity of fully charged TCNQ(i-Pr)$_2$ species at 1462 cm$^{-1}$.

Figure 2C:
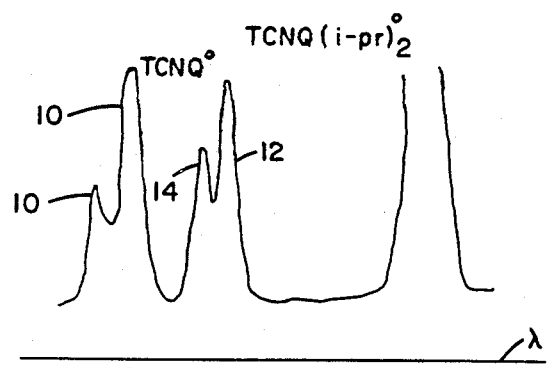

FIG. 2c shows the film after the optical field intensity had been increased to a higher threshold level. The second optical field intensity now exceeds the threshold necessary to induce bistate switching in both CuTCNQ and CuTCNQ(i-Pr)$_2$ salts. The resulting electrochemical charge transfer reaction now causes some of the CuTCNQ charge transfer complex to switch producing the neutral TCNQ° redox species. The optical characteristics of the third state can be identified by the appearance of Raman band 14 at 1451 cm$^{-1}$ which is associated with the presence of the neutral TCNQ° redox species.

The multistate switching observed in Cu$_2$[TCNQ:TCNQ(i-Pr)$_2$] might best be understood in view of Equations 2-4 following:

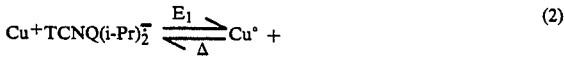
(2)

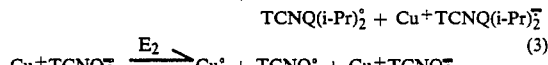
(3)

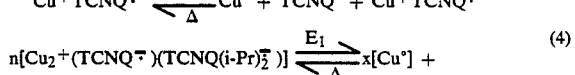
(4)

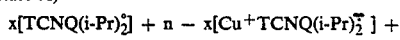

(State A)

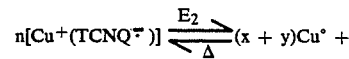

(State B)

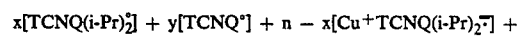

$x[TCNQ(i-Pr)_2^\circ] + y[TCNQ^\circ] + n - x[Cu^+TCNQ(i-Pr)_2^-] +$ (State C)

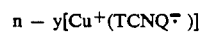

where, $E_2 > E_1$

Figures 3, 4:
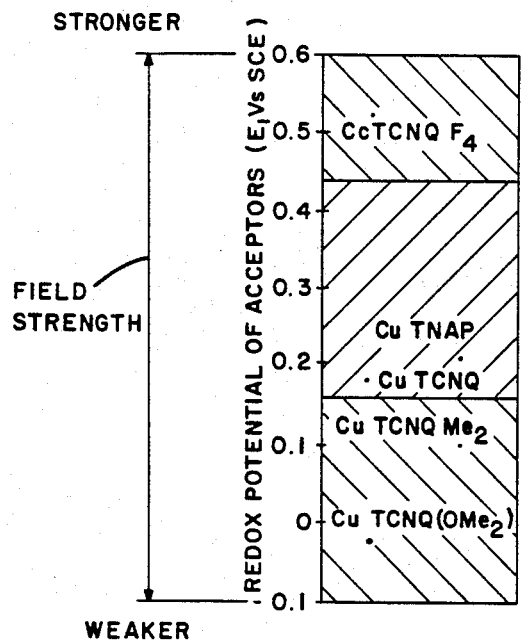
FIG. 3 is a table showing the relationship between reduction potential of the acceptor moiety and the field strength switching threshold.
FIG. 4 is a table which outlines some of the observed visible color changes in bistate material which can be mixed to form multistate material.

Equation 2 describes the two state switching reaction of a CuTCNQ (i-Pr)$_2$ film when an optical beam having and intensity exceeding $E_1$ illuminates the film. In this electrochemical reaction the switched state can be uniquely identified by detecting the presence of both the TCNQ(i-P)$_2$° and TCNQ(i-Pr)$_2$$^-$ redox species. Equation 3 shows the two state switching reaction of a CuTCNQ film when an optical beam having an intensity exceeding $E_2$ illuminates the film. In this electrochemical reaction, the switched state can be identified by the presence of both TCNQ° and TCNQ$^-$ redox species. It will be noted that the switching optical threshold level for the two Equations is dependent upon the redox potential of the acceptor moiety. The table in FIG. 3 shows the relationship between reduction potential of the acceptor moiety and the field strength switching threshold. In our example, a multistate amphoteric material can be fabricated from copper TCNQ and TCNQ(i-Pr)$_2$ because the optical threshold to switch CuTCNQ is different from the optical threshold necessary to switch CuTCNQ(i-Pr)$_2$. In general, such field strength dependence can be used to stepwise switch each bistable charge transfer salt thereby allowing the fabrication of a multistate amphoteric charge transfer medium.

Equation 4 shows the switching characteristic of the amphoteric mixture Cu$_2$[TCNQ:TCNQ(i-Pr)$_2$]. It will be noted that the amphoteric film is switched to the second state (state B) after the film has been illuminated with an optical field intensity greater than $E_1$ but less than $E_2$. The second state (state B) can be identified by detecting the TCNQ(i-Pr)$_2$° redox species. As previously shown in FIG. 2b, the optical characteristics of the TCNQ(i-Pr)$_2$° redox species can be identified by the Raman spectral band 12. When the optical intensity equals or exceeds $E_2$ the amphoteric material will be switched into the third state (state C). The third state is identified by detecting both the TCNQ° and the TCNQ(i-Pr)$_2$° redox species. Such redox species can be detected by Raman spectroscopic means as shown in FIG. 2c.

Therefore, Cu$_2$[TCNQ:TCNQ(i-Pr)$_2$] can be switched into three states: first, the amphoteric material will remain in the base state [state A] if the optical intensity is less than $E_1$; secondly, the amphoteric material will be switched into the second state (state B) if the optical intensity exceeds $E_1$ but is less than $E_2$; and thirdly, the amphoteric material can be switched from the second state to the third state (state B to C) or from the base state to the third state (states A to B to C) when the optical intensity equals or exceeds $E_2$. Therefore, by adjusting the intensity of the incident optical beam a spot on a $Cu_2[TCNQ:TCNQ(i-Pr)_2]$ film can be switched into one of three states. The switched state of the $Cu_2[TCNQ:TCNQ(i-Pr)_2]$ material can be reversed by using optical or thermal means to heat the material. It will be noted that Equation 4 is reversible and that the charge transfer reaction can be reversed, or the "memory erased" using thermal radiation to reform the original charge transfer complex [i.e., returning the amphoteric material to its base state].

The $Cu_2[TCNQ:TCNQ(i-Pr)_2]$ amphoteric material has been shown only as an example. Similar organic amphoteric materials can be formed from other complex mixtures of two or more charge transfer salts. In order to produce such an amphoteric organic charge transfer material two conditions must be met: (1) the two bistate charge transfer salts must switch at different optical intensity thresholds; and, (2) the redox species generated by the electrochemical reaction must have different electronic optical infrared and/or Raman spectral properties.

Applicants have discovered a number of organic charge transfer compounds which will undergo bistate optical switching as above-described, in the presence of energy from an optical field. Applicants have found that various TCNQ derivatives, when complexed with a metal donor, will form an organic charge transfer salt capable of optical memory and/or switching. Examples of these TCNQ derivatives are shown in the following table:

| | |
|---|---|
| TCNQ(OMe) | TCNQ I Me |
| TCNQ(OMe)$_2$ | TCNQI |
| TCNQ(OMe)(OEt) | TCNQ(OMe)(OCH$_3$)$_2$ |
| TCNQ(OMe)(O—i-Pr) | TCNQ(CN)$_2$ |
| TCNQ(OMe)(O—i-Bu) | TCNQ(Me) |
| TCNQ(O—i-C$_2$H$_5$) | TCNQ(Et) |
| TCNQ(OEt)(SMe) | TCNQ(i-Pr) |
| TCNQ Cl | TCNQ(i-Pr)$_2$ |
| TCNQ Br | TCNQ(i-Pr) |
| TCNQ Cl Me | TCNQ(i-Pr)$_2$ |
| TCNQ Br Me | |

Applicants have further found that if an organic electron acceptor containing at least one cyanomethylene functional group is complexed with a donor moiety to form an organic salt, the organic salt will have memory and switching capabilities. Also Applicants have found that if an organic electron acceptor containing at least one quinolene unit is complexed with a donor moiety to form an organic salt, that organic salt will also have memory and switch capabilities. In specific, if an organic salt is formed from the following organic electron acceptors, the organic salt will be capable of optical memory and/or switching: tetracyanoquinodimethane (TCNQ), tetracyanonapthoquinodimethane (TNAP), tetracyanoethylene (TCNE), and 2,3-dichloro-5,6-dicyano-1, 4-benzoquinone (DDQ), hexacyanobuadiene (HCBD), and 11, 11, 12, 12-tetracyano-1.4 naphthoquinodimethane (benzo-TNAP), and 2,5-bis (dicyanomethylene)-2, 5-dihydrothiophene, and 2,5-bis (dicyanomethylene)-2, 5-selenophene, and thiophene-(T)-TCNQ, and selenophene-(Se)-TCNQ and tetracyano-quinoquinazolinoquinazoline (TCQQ) and hexamethylcyanotrimethylenecylopropane (HMCTMCP) and 2,4-bis (dicyanomethylene)-1,3-dithietan (BDDT), and any of the TCNQ derivatives shown in the above table.

Applicants have discovered that if the following metals are complexed with the above-referenced organic electron acceptor to form an organic salt, the organic salt will switch optically: copper, silver, lead, nickel, lithium, sodium, potassium, barium, chromium, molybdenum, tungsten, cobalt, iron, antimony, cesium and magnesium. In addition, the following organic substances can also act as donors, and if complexed with an organic electron acceptor to form an organic salt, the organic salt will be capable of optical memory and/or switching: tetrathioethylenes, dithiodamioethylenes, dithiodisalinoethyelenes, tetramionethylenes, arenes, and aromatic hydrocarbons. It is to be understood that other organic transfer salts formed with organic electron acceptors having either cyanomethylene functional groups or quinolene units and other organic salts having similar characteristics, may be found which switch from the above-referenced first state to second state in the presence of optical radiation. The bistate optical switching compounds can be combined as taught by the present invention to produce a multistate amphoteric organic charge transfer medium.

The switched states for such amphoteric organic charge transfer materials can be distinguished because Raman modes of neutral and radical ion species are strongly affected by substitute groups attached to the quinoid structure. Optical properties associated with different redox species can be identified by a variety of different techniques. In general, spectroscopic means can be used to determine the particular state of a location on a multistate amphoteric charge transfer medium. Both infrared spectroscopic means and Raman spectroscopic means can be used to identify the particular switched state. Although Applicants prefer to use Raman spectroscopic techniques, or similar techniques which analyze a particular narrow band of laser light reflected from the multistate amphoteric organic charge transfer medium, it is to be understood that any other well known spectroscopic or similar technique can be used which has the capability of identifying a change in oxidation state of the organic electron acceptor moiety or change in the reduction state of the donor moiety (i.e., X-ray photoelectron spectroscopy (XPS), Raman or infrared spectroscopic means can detect the change in oxidation state of the donor and/or the organic electron acceptor moiety).

Figure 5:
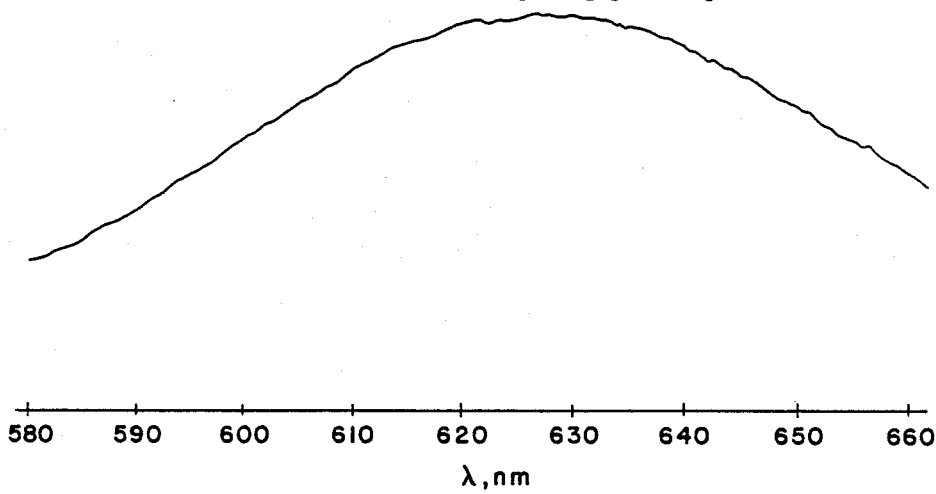
FIG. 5 is a graph showing the fluorescence of TCNQ[(OMe)(O-i-Pr)] in its neutral state.
Figure 6:
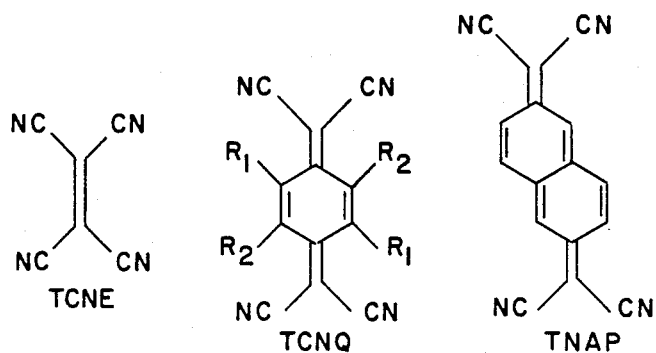
FIG. 6 shows molecular drawings of radical ion acceptor molecules which can be used to make multistate switching material in accordance with the present invention.

In certain cases the redox species characteristic of a particular switched state can be identified by visual color change in the material. The table in FIG. 4 outlines some of the observed color changes in bistate material which can be mixed to form multistate material. In addition, some of the organic acceptor molecules such as TCNQ(OMe)$_2$, TCNQ(Oi-Pr)(OMe) and TCNQ(i-Pr)$_2$ exhibit a broad band fluorescence in the oxidized state but not in the reduced state. This fluorescence, shown in FIG. 5, can be used to record the change in oxidation state and to separate the different redox species from one another for certain materials in this case TCNQ(OMe)(O—i-Pr) (e.g., the presence of fluorescence may indicate that a particular neutral redox species is present). Therefore, multistate amphoteric charge transfer materials can be produced from two different bistate radical ion salts. Such multiswitching can be made from a variety of related radical ion acceptor molecules. Some examples of such acceptor molecules are listed above and shown in FIG. 6. The multiswitching effect can be observed in these acceptors by mixing different molecules together or by changing the donor metal. For example, a multistate amphoteric organic charge transfer material made from a film composed of CuTCNQ and AgTCNQ will switch at different applied optical fields. The optical field intensity at which a constituent bistate charge transfer salt switches is dependent upon the strength of the donor-acceptor bond.

It is also contemplated by the inventors that three or more bistate organic charge transfer salts can be combined as taught herein to form an amphoteric charge transfer material which will exhibit four or more switching states.

MULTISTATE AMPHOTERIC CHARGE TRANSFER COMPLEX FORMED BY CHEMICALLY LINKING TWO OR MORE BISTATE CHARGE TRANSFER MOLECULES

An alternative method for producing a multistate amphoteric charge transfer material is to chemically link various acceptor molecules together through sigma and pi bonding systems to produce a large molecule. The large molecule produced is amphoteric and can be switched optically into several states with each state identifiable by a unique set of redox species. This method guarantees that the acceptor molecules will react with the metal donor equally to form a molecular multiswitching system. FIG. 7 shows several examples of two linked radical ion acceptor molecules. It will be noted that many known chemical linking chains can be used other than those illustrated in FIG. 7. The two chemically linking molecules shown in FIG. 7, connect the TCNQ moiety with a TCNQ moiety having substitute R groups such as chlorine, bromine, fluorine, $CH_3$, OMe or other similar substituent groups. It will be noted that during the electrochemical switching reaction the covalent bonds between the linking chain and the TCNQ moiety and the linking chain and the TCNQ derivative moiety do not break. It will also be noted that Raman spectroscopic modes for the redox species are strongly affected by such substitute groups attached to the quinoid structure—thus allowing various redox species formed during the electrochemical reaction to be easily identified using optical and spectroscopic techniques.

Equation (5) describes the multistate switching reaction for a $(TCNQ)\text{-}CH_2SCH_2COCH_2SCH_2\text{-}(TNAP)$ amphoteric charge transfer molecule:

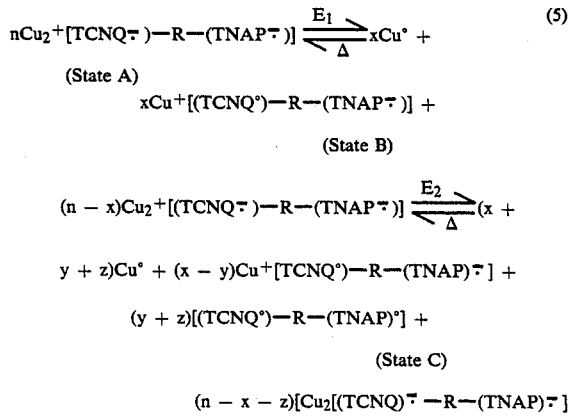

where, $R = CH_2SCH_2COCH_2SCH_2$
$E_2 > E_1$

When the (TCNQ)-R-(TNAP) amphoteric charge transfer material, where R represents the $-CH_2SCH_2COCH_2SCH_2-$ chemical linking chain, is illuminated by an optical beam having an intensity equal to or greater than $E_1$ but less than $E_2$, the material will switch from the base state (state A) into the second state (state B). As shown in Equation (5) the $[(TCNQ^{\bar{}})\text{-}R\text{-}(TNAP^{\bar{}})]$ and $[(TCNQ^{\bar{}})\text{-}R\text{-}(TNAP^{\bar{}})]$ redox species are present in the second state. Optical and spectroscopic means, discussed earlier in this specification, can identify the second state by detecting the presence of the $[(TCNQ^°)\text{-}R\text{-}(TNAP^{\bar{}})]$ redox species. When the optical intensity is increased and is equal to or greater than $E_2$ the material will be switched from the second state to the third state (state B to C) or from the initial or base state to the third state (state A to B to C). As shown in Equation (5) the $[(TCNQ^°)\text{-}R\text{-}(TNAP^°)]$, $[(TCNQ^{\bar{}})\text{-}R\text{-}(TNAP^{\bar{}})]$ and $[(TCNQ^°)\text{-}R\text{-}(TNAP^{\bar{}})]$ redox species are present in the third state. Optical or spectroscopic means, discussed earlier in this specification, can identify the third state by detecting the presence of the $[(TCNQ^°)\text{-}R\text{-}(TNAP^°)]$ redox species. It must again be noted that the covalent bonds joining the linking chain to the TCNQ and TNAP moieties are not broken even when the acceptor moiety is in the reduced state, e.g., $[(TCNQ^°)\text{-}R\text{-}(TNAP^°)]$ redox species.

Although the $[(TCNQ)\text{-}R\text{-}(TNAP)]$ compound has been used to describe the amphoteric material formed by a chemically linking process, it is to be understood that other bistate organic charge transfer salt can be joined by equivalent chemical chains to form amphoteric molecules. The molecules diagrammed in FIG. 7 as well as the bistate switching compounds mentioned earlier in this application can be chemically linked to form amphoteric compounds which will exhibit multistate optical switching. It is within the contemplation of the inventors to claim chemically-linked amphoteric materials generated by linking bistate organic transfer salts. The only limitation being that the bistate organic charge transfer salts, which are linked to form the amphoteric material must: (1) switch from their base state to a switched state at different applied fields at optical frequencies; and, (2) the redox species generated by the multistep redox reaction must have features easily identifiable by optical/spectroscopic means.

It is also contemplated by the inventors that two or more bistate organic charge transfer salt molecules or two or more multistate molecular compounds can be chemically linked to form a large molecular complex which can be optically switched into four or more states.

It must also be noted that Equation (5) represents a reversible reaction and that thermal energy generated by optical or thermal means can return part or all of the amphoteric material to the base state. By this process, information stored on such an amphoteric charge transfer medium can be "erased".

MULTISTATE AMPHOTERIC CHARGE TRANSFER MATERIAL FORMED FROM A DELOCALIZED AMPHOTERIC MOLECULAR SYSTEM

Figure 8:
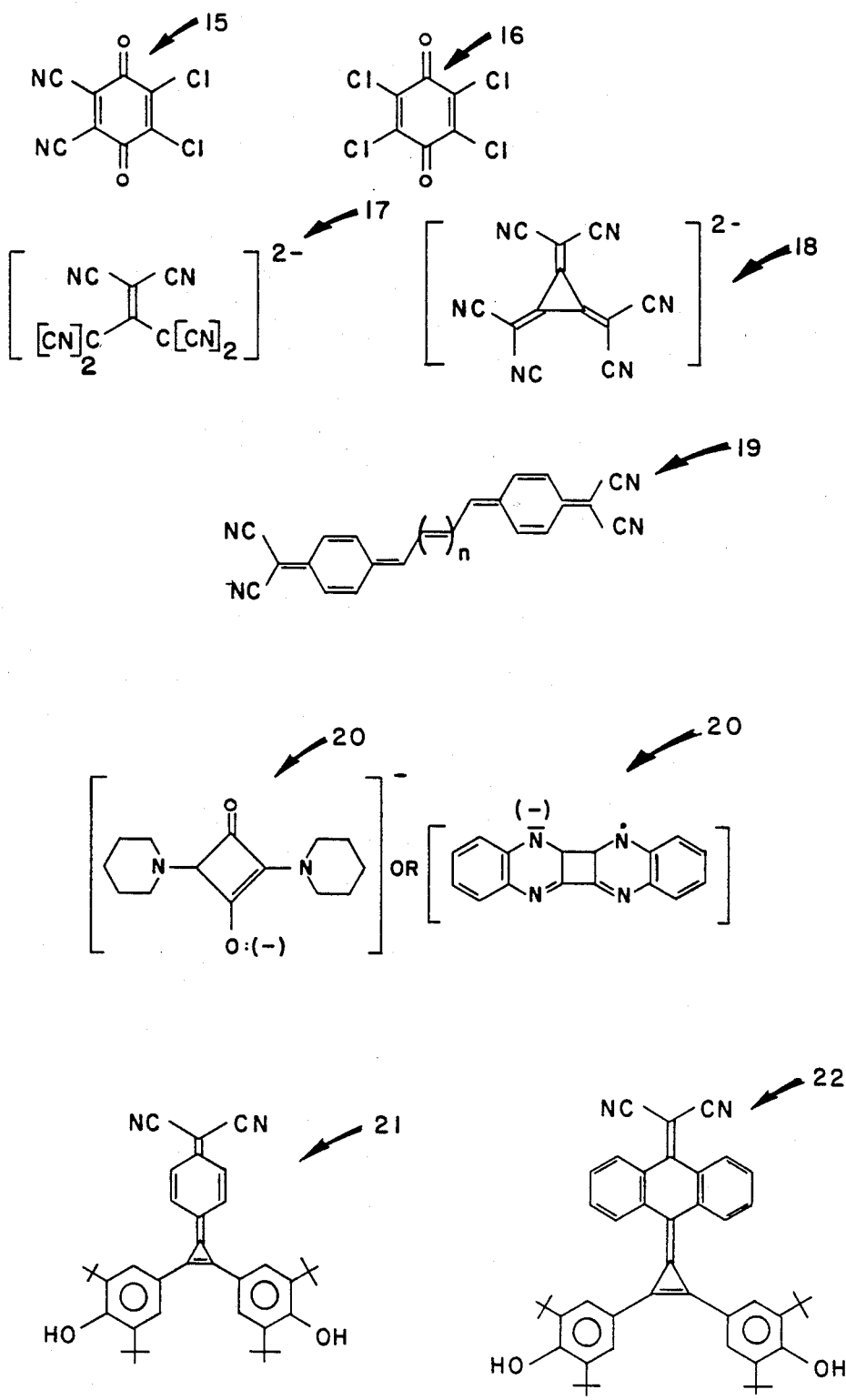
FIG. 8 shows several highly delocalized radical ion acceptor molecules which exhibit multistate switching as taught by the present invention.

The aforementioned concepts can be utilized to synthesize and develop large delocalized molecular system which exhibit amphoteric redox properties in addition to the optically induced charged transfer properties associated with the TCNQ class of organic materials. Several important factors must be met to accomplish this end: (1) the synthesized molecule must undergo an optically induced redox process and transfer electrons inter or intramolecular without rupturing electron pair sigma bonds; (2) each radical partner in the molecular system must exhibit independent thermal stability; (3) the optically induced electrochemical reaction which generates various redox species could be reversible; and, (4) the redox species must be readily identifiable using optical or other spectroscopic techniques. In essence, the sensitized molecules combine the multistate redox feature found in many known amphoteric molecules with the optical properties associated with the switching effect observed in copper and silver TCNQ type complexes. Examples of strongly delocalized radical ion acceptor molecules which exhibit the multiswitching effect are shown in FIG. 8. Several of these amphoteric molecules (15,16) are derivatives of the TCNE radical ion with inserted alkene or aromatic groups (i.e., 2,3-dichloro-5,6-dicyano-1,4-benzoquinone and p-chloranil). Other molecules shown in FIG. 8 (17, 18) are two-stage radical ions in which the end groups form part of a cyclic pi-system with exhibited aromatic characteristics in the oxidized state (i.e. 2-dicyanomethylene-1,1,3,3 tetracyanopropanediide and hexacyanotrimethylenecyclopropanediide. In addition, FIG. 8 illustrates one of a class of delocalized molecules (19) composed of tetracyanoarenoquinodimethane with an extended pi-system; and, a compound (20) having alternate forms 1,3-squaric acid diamides; and, two compounds (21,22) composed of dicyanomethlyidene substituted with quinocyclopropenes. In addition to acceptor type amphoteric molecules, amphoteric donor molecules complexed with radical ion electron acceptors will exhibit the optically induced multiswitching phenomena. FIG. 9 shows several such amphoteric donor molecules including compound (23) benzotrithiophene; compound (24) heteroarene with bridgehead nitrogen atoms; compound (25) 4, 4'-bipyridium salts; compound (26) 4,4'-bithiopyran; compound (27) 1,2-bis (thioxanthene-9-ylidene) ethene; and, one of a class of compounds (28) 1,2-bi-(4H-thiopyran-4-ylidene) where X= substitute electron donors and/or electron acceptors.

The acceptor compounds can be complexed with various metals such as copper, lead, nickel and silver. The multistate amphoteric charge transfer molecular compounds are grown as thin films or as single crystals which can be fabricated into various device geometries.

Equation (6) describes the multistate switching reaction in the material formed from $Cu_2[C_{10}N_6]$, an amphoteric charge transfer molecule:

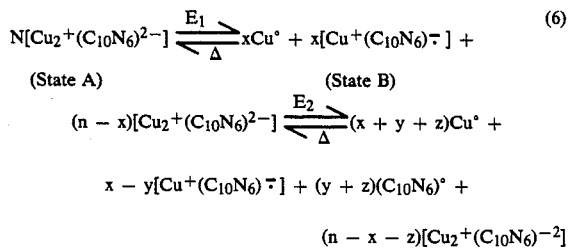

where $E_2 > E_1$

When the $Cu_2[C_{10}N_6]$ material is illuminated by an optical beam having a field intensity equal to or greater than $E_1$ but less than $E_2$, the amphoteric material will switch from the initial or base state (State A) into the second state (State B). As shown in Equation (6), the $Cu_2[C_{10}N_6]^{-2}$, and $Cu^+[C_{10}N_6]^{-}$ redox species are present in the second state. Optical and spectroscopic means discussed earlier in this specification, can identify the second state by detecting the presence of these redox species. When the optical intensity is increased and is equal to or greater than $E_2$ the material will be switched from the second state to the third state (State B to State C) or from the base state to the third state (State A to B to C). As shown in Equation (6), the $Cu_2^+[C_{10}N_6]^{-2}$, $Cu^+[C_{10}N_6]^{-}$, $Cu^\circ$ and $[C_{10}N_6]_2^\circ$ redox species are present in the third state. Optical/spectroscopic means, discussed earlier in the specification, can identify the third state by detecting the presence of the $Cu^\circ [C_{10}N_6]_2^\circ$ redox species.

Although the $Cu_2+[C_{10}N_6]^{-2}$ molecular structure was shown in the above example, it is understood that other amphoteric molecular structures described earlier in FIGS. 8 and 9, or similar compounds, can form synthesized molecular complexes which exhibit optical multistate switching. It is also contemplated that such multistate synthetic molecules can be fabricated which have four or more switching states in accordance with the present invention.

It must also be noted that Equation (6) represents a reversible electron transfer reaction and thermal energy qenerated by optical or thermal means can return all or part of the amphoteric material to the initial state. By this process, the memory medium formed from such synthetic amphoteric molecules can be "erased".

GENERALIZED SWITCHING CHARACTERISTICS OF MULTISTATE AMPHOTERIC CHARGE TRANSFER MATERIALS

Figures 10, 11:
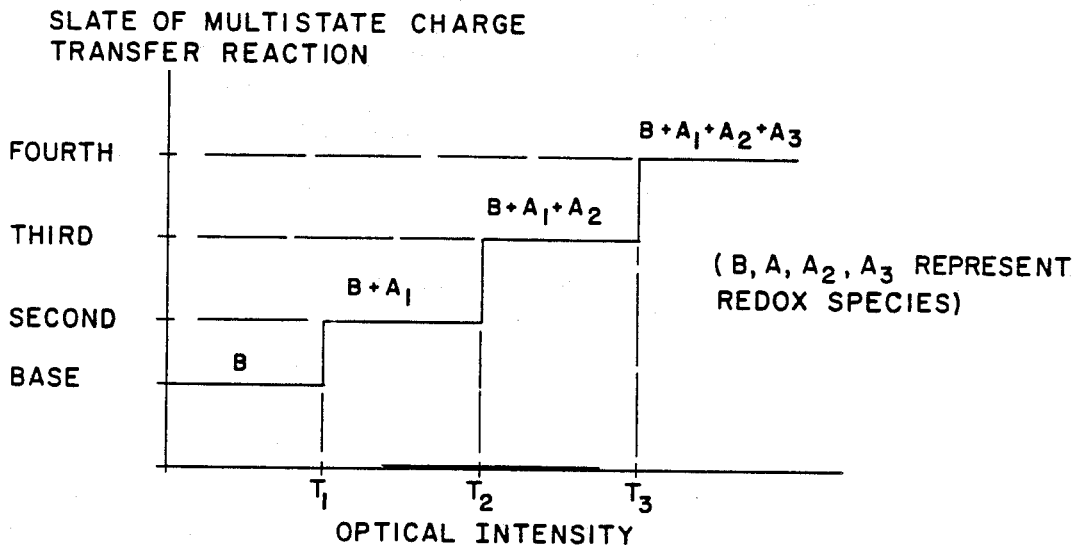
FIG. 10 graphically illustrates the generalized optical switching characteristics of the multistate amphoteric charge transfer material as taught by the present invention.
FIG. 11 is a truth table illustrating the generalized optical switching characteristics of multistate amphoteric charge transfer material as taught by the present invention.

The inventors have described three processes for forming a multistate amphoteric charge transfer medium. Generally, the amphoteric material is optically switched through a series of states by increasing the optical intensity. FIG. 10 graphically illustrates the generalized optical switching characteristics. In the first or base state the organic switching medium is composed of redox species identified as "B" in FIG. 10. An optical "write" beam is used to switch a spot on the material into a switched state (such spot referred as a "data storage spot"). If the optical intensity of the "write" beam exceeds an intensity threshold $T_1$, but is less than threshold $T_2$, the illuminated spot will jump to the second state. The second state can be identified by the appearance of a new redox species identified by $A_1$ in FIG. 10. (NOTE: The B redox species are still present at some reduced percentage and the $A_2$ and $A_3$ redox states are essentially absent.) As noted earlier, optical and spectroscopic means, such Raman spectroscopy can identify the presence of the $A_1$ redox species. If, however, the optical intensity exceeds $T_2$ but is less than $T_3$, the material in the illuminated spot will jump into the third state. In the third state, the B, $A_1$, and $A_2$ species are present and can be identified by optical or spectroscopic means. Similarly, if the optical threshold exceeds $T_3$, the material in the illuminated spot will be switched to the fourth state, where the B, $A_1$, $A_2$ and $A_3$ redox species are present. By identifying the redox species present at a particular "data storage spot", one can readily determine the switched state of that spot.

FIG. 11 is a truth table for such a generalized amphoteric system. The table shows that by identifying the presence of certain redox species, the state of the "data storage spot" can be determined. For example, if the $A_4$ redox species is detected by optical means, it indicates that the "data storage spot" is in state 4. If the $A_3$ species is detected but not significant amounts of the $A_4$ redox species, we are in the third state. If the $A_2$ species is detected but not significant amounts of the $A_3$ and $A_4$ redox species, we are in the second state. If, however, the $A_2$. $A_3$ and $A_4$ species are not significantly detected the "data storage spot" is in the first or base state.

The switching phenomenon observed in such amphoteric charge transfer materials can be either threshold switching or memory switching. For threshold switching the illuminated spot rapidly returns to the base state after the optical beam is removed. For memory switching, the illuminated spot requires additional energy to return to the lower thermodynamically stable state after the beam is removed. In most cases, ambient thermal energy is insufficient to rapidly reverse the electrochemical reaction back to the lower state (e.g., thermodynamically more stable state). The length of time memory can be retained depends on: (1) the particular material, (2) the diameter of the "write" beam; (3) the duration and intensity of the "write" beam; and (4) the thickness of amphoteric charge transfer film. In several cases it has been demonstrated that the greater the bonding energy between the donor and acceptor species the larger the threshold level needed to switch from one state to another and the greater likelihood that the switching action will be that of memory switching. Similarly, incident optical energy necessary to switch the amphoteric charge transfer material from one state to another depends on several factors including: (1) bonding energy; (2) size of the illumination "write" beam; (3) the duration of the optical "write" beam, and (4) the thickness or geometric arrangement of the amphoteric film or material. It will be noted that the frequency of the optical beam can be chosen from the ultraviolet, visible, and/or infrared regions of the electromagnetic spectrum.

Application of heat energy to a portion of the amphoteric material, which may be generated by an optical source, causes the amphoteric material to return to a more thermodynamically stable state. If sufficient thermal energy is applied the amphoteric material will return to the base state. In the preferred apparatus, described later, the inventors used heat generated by a $CO_2$ laser to return a portion of the material to the base state.

MULTISTATE OPTICAL SWITCHING APPARATUS

Figure 12:
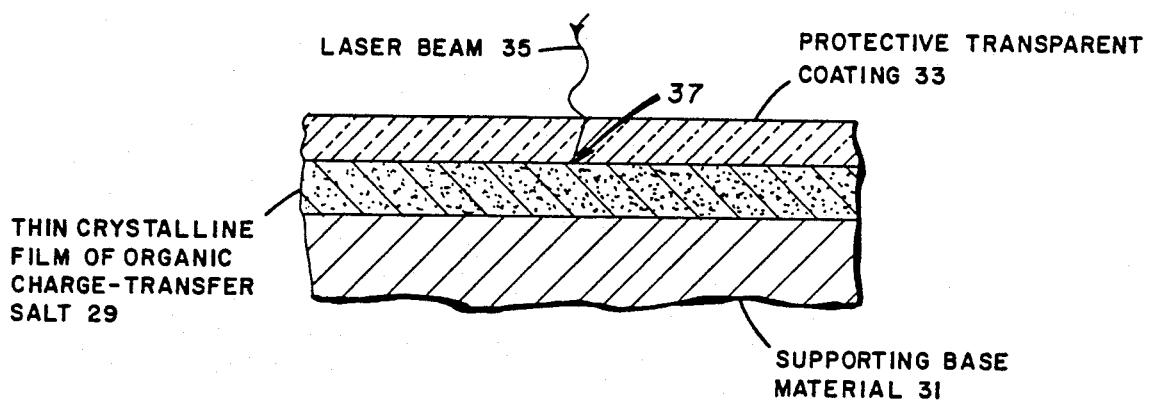
FIG. 12 is a schematic diagram of an optical storage device using such multistate amphoteric charge transfer material as taught by the present invention.

The multistate amphoteric charge transfer material described in this application, can be used as the optical storage medium in various optical switching and storage apparatus. FIG. 12 is a schematic diagram of an optical storage system using such a multistate amphoteric charge transfer material as the optical storage medium. The amphoteric charge transfer material 29 is deposited on or in a supporting base material 31. The amphoteric material can be grown on a metal donor base material 31, as described earlier in the specification, or other methods such as sputtering can deposit the amphoteric material 29 on the base material 31. An optional transparent protective coating 33 may be deposited on the surface of the amphoteric material film 29. An optical "write" beam 35 is focused on a specific spot 37 on the surface of the amphoteric material 29. (This spot is referred to as a "data storage spot".) The optical "write" beam can be a high intensity light source or laser source such as an Argon or $CO_2$ laser focused to generate a field on the film surface in the area of the "data storage spot". The optical "write" beam has several discrete intensity levels, each intensity level causing the "data storage spot" to switch into a particular state.

Therefore, the intensity of the beam will cause the "data storage spot" to switch states—for example, in a three-state optical medium where the optical beam intensity is at the first threshold ($T_1$) the "data storage spot" will switch from the base state to the second state; at intensity $T_2$ the "data storage spot" will be switched to the third state; and, at an intensity of $T_3$ the "data storage spot" will be switched into the fourth state. As mentioned previously, the optical intensity necessary to produce the above state changes depends on the choice of the amphoteric material, the film thickness or geometry and the area and intensity of the optical "write" beam.

For memory systems, an optical "write" 35 can be directed by known optical or electrical control means to other "data storage spot" locations on the surface of the amphoteric charge transfer material 29 and can switch such other locations from the base state to one of several switch states. By controlling the beam intensity at a specific "data storage spot" location, multiple bits of data can be stored at that location in the optical storage medium.

For example, with an amphoteric organic charge transfer material, having a three-stage electron transfer reaction, an optical "write" beam can be used to switch the optical storage medium through the base state to one of three states depending on the intensity of the optical field strength. Therefore, the "write" beam could be used to store a three-bit data code at each "data storage spot". If the memory apparatus were used in conjunction with a binary computer, the first or base state could be represented by "01", the second switched state could be represented by a "10"; and, the third switched state could be represented by an "11". Alternatively, the memory apparatus could be used in connection with a base three computing system.

Figure 13:
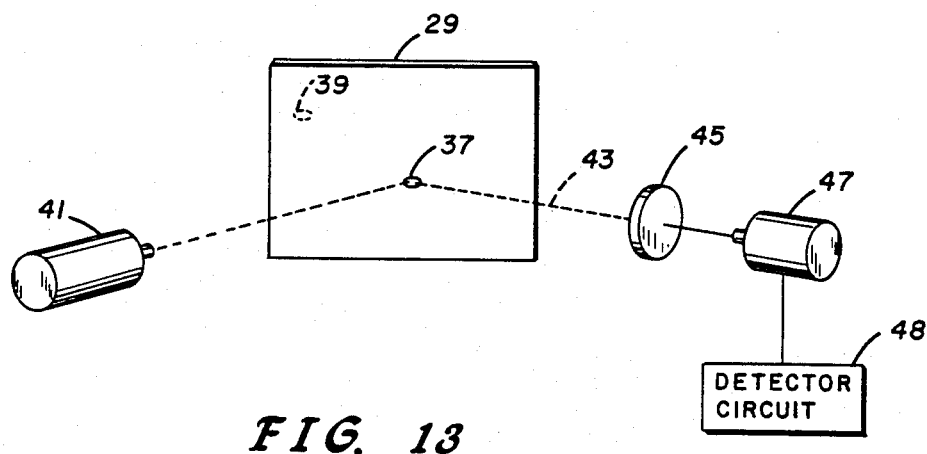
FIG. 13 is a schematic representation of the optical means used to evaluate the state of each "data storage spot"; and, FIG. 14 is a schematic drawing showing the thermal erasure means of the optical storage device.

Once data has been stored on the storage medium, a spectroscopic means can be used to determine the particular switched state of the "data storage spot" being evaluated. FIG. 13 is a schematic of the spectroscopic means and shows "data storage spot" localizations 37 and 39, which are two of a possible plurality of storage locations containing data. A light source, or "reading" optical beam 41 is directed to illuminate one of the locations 37 with an intensity well below the first intensity threshold, so that the state at location 39 is not disturbed. The light source 41, for Raman spectroscopic analysis, could be a monochromatic source and Applicants suggest the use of a laser source. Reflected and/or emitted light 43 from the selected location on the film surface 37 is collected and filtered by the optical band pass filter 45 allowing reflected light to pass through an optical means 47 for measuring the spectral intensity of each desired band. The optical means looks at the magnitude of particular spectral bands (Raman bands) which identify a particular redox species. (It would be possible to have a plurality of filter/detector combinations to measure the magnitude of reflected light in each band of interest. Alternatively, traditional Raman spectroscopic means could be utilized. Based on the magnitude of the spectral intensity in each selected band, logic detection circuitry 48, of known design, determines the set of redox species present, which in turn uniquely defines the switched state of that "data storage spot".

The "reading" optical beam 41 can be directed by well known optical means to each of the plurality of "data storage spot" locations (e.g., 37, 38) on the surface of the amphoteric organic charge transfer material 29 to determine the state of each particular location. That is to say, for an amphoteric charge transfer material having three states, the spectroscopic means will determine the state of a particular "data storage spot" and thereby determine the three-bit word stored at that "data storage spot".

Figure 14:
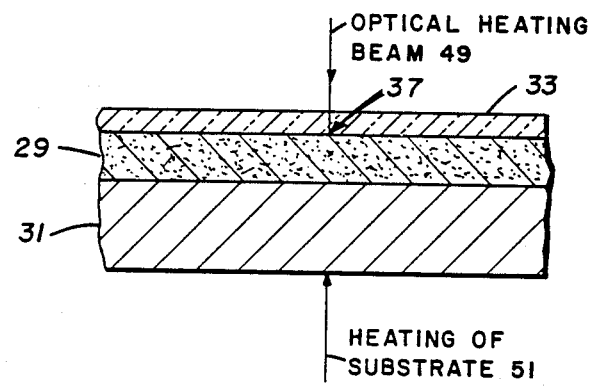

FIG. 14 is a schematic drawing showing the thermal erase means which is used to reverse the electrochemical charge transfer reaction and cause at least one of a plurality of "data storage spot" locations on the surface of the amphoteric organic charge transfer material 29 to return to the base state. FIG. 14 shows two alternative embodiments for the thermal erase means. The first embodiment uses thermal radiation from an optical beam 49 focused on the location 37 to generate sufficient heat to switch the area back to the base state. Applicants have found that the $CO_2$ laser, with an intensity below the first threshold, can be focused on location 37 for a time period long enough to generate sufficient thermal energy to switch the location back to the base state, or more thermodynamically stable state. The optical heating beam 49 can be directed by a well known optical means to erase other locations on the amphoteric organic charge transfer material surface 29. An alternative embodiment uses an electrical heating g element 51, located below substrate 31, to generate sufficient thermal energy to "erase" a portion of the amphoteric charge transfer material film 29.

In an alternative embodiment, the optical write beam 35, optical read beam 41, and the optical heating beam 49, can be generated by a single laser source by varying the intensity and duration of the illuminating beam. It is within the contemplation of the Applicants that other well known means can be used to generate the desired optical "write/read" and "erase" beams, and to direct such beams to the desired location on the amphoteric organic charge transfer material surface.

Obviously many modifications and variations of the present invention are possible in light of the above teachings. It is therefore to be understood that within the scope of the appended claims the invention may be practiced otherwise than as specifically described.

What is claimed is:

1. An optically sensitive apparatus comprising:
a multistate optically sensitive organic charge transfer medium wherein the first state is a first oxidation state and is composed of at least two different organic compounds, each of said organic compounds containing an electron donor moiety complexed with an organic electron acceptor moiety, wherein each of said organic compounds has a different redox potential so as to switch from the first oxidation state to a second oxidation state in response to the application of electromagnetic energy at an optical frequency and at a field strength unique to said each of said organic compounds, thus providing a different second state for each organic compound, and wherein the oxidation states of the first state and each second state have identifiably different optical spectra; and
a source of said electromagnetic energy.

2. The apparatus of claim 1, wherein the source of electromagnetic energy is one of a high intensity light source and a laser source.

3. The apparatus of claim 2, wherein said source of electromagnetic energy is a laser source illuminating at least one discrete area on said organic charge transfer medium.

4. The apparatus of claim 1, further comprising a means for varying the field strength of said source of electromagnetic energy at optical frequencies to a plurality of particular levels, each particular level unique to a particular one of said organic compounds for causing said organic electron acceptor moiety of a particular one of said organic compounds to switch from a first oxidation state to a second oxidation state.

5. The apparatus of claim 3, further comprising spectroscopic means focused on said at least one discrete area of said organic charge transfer medium for determining the oxidation state of each of said at least two organic compounds.

6. The apparatus of claim 5, wherein the particular oxidation state of each of said organic compounds has a unique Raman absorption spectra, and wherein said spectroscopic means utilizes such Raman adsorption spectra to identify the oxidation state of said at least one discrete area.

7. The apparatus of claim 1, further comprising a source of thermal energy for initiating a reverse reaction in said organic charge transfer medium for returning at least one of said organic compounds to the first oxidation state from the second oxidation state through the application of thermal energy.

8. The apparatus of claim 7, wherein the source of thermal energy is a laser source.

9. The apparatus of claim 7, wherein said source of electromagnetic energy illuminates at least one discrete area on said organic charge transfer medium and further wherein said thermal energy is applied to the same at least one discrete area.

10. The apparatus of claim 1, further comprising a base material to support the charge transfer material and a transparent protective coating.

11. The apparatus of claim 1, wherein a particular one of said organic compounds further comprises an organic electron acceptor moiety selected from the group consisting of tetracyanoquinodimethane (TCNQ), tetracyanonapthoquinodimethane (TNAP), tetracyanoethylene (TCNE) and 2, 3-dichloro-5,6-dicyano1, 4-benzoquinone (DDQ), hexacyanobutadiene (HCBD) and 11, 11, 12, 12-tetracyano-1,4 naphthoquinodimethane (benzo TNAP) and 2,5-bis (dicyanomethalene)-2, 5-dihydrothiophene and 2,5-bis (dicyanomethylene)-2, 5-selenophene and thiophene-(T)-TCNQ and selenophene-(Se)-TCNQ and tetracyanoquinoquinazolinoquinazoline (TCQQ) and hexamethylcyanotrimethylene cyclopropane (HMCTMCP) and 2,4-bis (dicyanomethylene)-1,3-dithietan (BDDT) and any of the TCNQ derivatives defined by the notation:

| | |
|---|---|
| TCNQ(OMe) | TCNQ IMe |
| TCNQ(OMe)$_2$ | TCNQI |
| TCNQ(OMe)(OEt) | TCNQ(OMe)(OCH$_3$)$_2$ |
| TCNQ(OMe)(O—i-Pr) | TCNQ(CN)$_2$ |
| TCNQ(OMe)(O—i-Bu) | TCNQ(Me) |
| TCNQ(O—i-C$_2$H$_5$) | TCNQ(Et) |
| TCNQ(OEt)(SMe) | TCNQ(i-Pr) |
| TCNQ Cl | TCNQ(i-Pr)$_2$. |
| TCNQ Br | |
| TCNQ ClMe | |

-continued

TCNQ Br Me

12. The apparatus of claim 1, wherein a particular one of said organic compounds further comprises an electron acceptor moiety selected from the group consisting of:
TCNQ (OMe)
TCNQ (OMe)$_2$
TCNQ(OMe)(OEt)
TCNQ Cl
TCNQ Br
TCNQ Cl Me
TCNQ Br Me
TCNQ I Me
TCNQ I
TCNQ (CN)$_2$
TCNQ (Me)
TCNQ (Et)
TCNQ (i-Pr).

13. The apparatus of claim 1, wherein a particular one of said organic compounds further comprises an electron donor moiety selected from the group consisting of copper, silver, lead, nickel, lithium, sodium, potassium, barium, chromium, molydenum, tungsten, cobalt, iron, antimony, cesium and magnesium and having chemical properties which permit formation of an organic salt when complexed with an organic electron acceptor.

14. The apparatus of claim 1, wherein a particular one of said organic compounds further comprises an electron donor moiety which is selected from the group consisting of tetrathioethylenes, dithiodiaminoethylenes, dithiodiselenoethylenes, tetraminoethylenes, arenes, aromatic hydrocarbons, and aromatic heterocyclics having chemical properties which permit formation of an organic salt when complexed with an electron acceptor moiety.

15. The apparatus of claim 1, wherein a particular one of said organic compounds further comprises an electron donor moiety which is selected from the group consisting of silver and copper.

16. The apparatus of claim 1, wherein a particular one of said organic compounds further comprises an organic electron acceptor moiety which is an organic material incorporating at least one cyanomethylene functional group and having the chemical properties which permit formation of an organic salt when complexed with an electron donor moiety.

17. The apparatus of claim 1, wherein a particular one of said organic compounds further comprises an organic electron acceptor moiety which is an organic material incorporating at least one quinolene unit and having the chemical properties which permit formation of an organic salt when complexed with an electron donor moiety.

18. The apparatus of claim 1, wherein said first oxidation state of each of said organic compounds contains the organic electron acceptor moiety in the reduced state and wherein said second oxidation state contains the organic electron acceptor moiety in both the reduced and neutral states.

19. The apparatus of claim 1, wherein the electron acceptor moiety of each of said organic compounds is chemically linked so as to form a single delocalized molecule.

20. An optically sensitive apparatus comprising:
a multistate optically sensitive organic charge transfer medium wherein the first state is a first oxidation state and is composed of at least one organic compound containing an electron donor moiety complexed with an organic electron acceptor moiety, said organic electron acceptor moiety having at least two structurally different regions, wherein each region has a different redox potential so as to switch from the first oxidation state to a second oxidation state in response to the application of electromagnetic energy at an optical frequency and at a field strength unique to said each of said regions, thus providing a different second state for each organic compound, and wherein the oxidation states of the first state and each second state have identifiably different optical spectra; and
a source of electromagnetic energy.

21. The apparatus of claim 20, wherein the source of electromagnetic energy is one of a high intensity light source and a laser source.

22. The apparatus of claim 21, wherein said source of electromagnetic energy is a laser source illuminating at least one discrete area on said organic charge transfer medium.

23. The apparatus of claim 20, further comprising a means for varying the field strength of said source of electromagnetic energy at optical frequencies to a plurality of particular levels, each particular level unique to a particular one of said organic compounds for causing said organic electron acceptor moiety of a particular one of said organic compounds to switch from a first oxidation state to a second oxidation state.

24. The apparatus of claim 22, further comprising spectroscopic means focused on said at least one discrete area of said organic charge transfer medium for determining the oxidation state of each of said at least two organic compounds.

25. The apparatus of claim 24, wherein the particular oxidation state of each of said organic compounds has a unique Raman absorption spectra, and wherein said spectroscopic means utilizes such Raman adsorption spectra to identify the oxidation state of said at least one discrete area.

26. The apparatus of claim 20, further comprising a source of thermal energy for initiating a reverse reaction in said organic charge transfer medium for returning at least one of said organic compounds to the first oxidation state from the second oxidation state through the application of thermal energy.

27. The apparatus of claim 26, wherein the source of thermal energy is laser source.

28. The apparatus of claim 26, wherein said source of electromagnetic energy illuminates at least one discrete area on said organic charge transfer medium and further wherein said thermal energy is applied to the same at least one discrete area.

29. The apparatus of claim 20, further comprising a base material to support the charge transfer material and a transparent protective coating.

30. The apparatus of claim 20, wherein said organic compound comprises an organic delocalized molecule, and wherein said organic electron acceptor moiety has at least two isolated regions, each isolated region capable of independently changing oxidation state in response to the application of electromagnetic energy at optical frequencies.

31. The apparatus of claim 20, wherein said organic electron acceptor moiety comprises at least two individual component electron acceptor moieties, each of said component electron acceptor moieties having a different redox potential and each of said component electron acceptor moieties joined together through covalent linkage.

32. The apparatus of claim 31, wherein each of said component electron acceptor moieties is material selected from the group consisting of tetracyanoquinodimethane (TCNQ), tetracyanonaphthoquinodimethane (TNAP), tetracyanoethylene (TCNE) and 2, 3-dichloro-5,6-dicyano-1, 4-benzoquinone (DDQ), hexacyanobutadiene (HCBD) and 11, 11, 12, 12-tetracyano-1,4 naphthoquinodimethane (benzo TNAP) and 2,5-bis (dicyanomethalene)-2, 5-dihydrothiophene and 2,5-bis (dicyanomethylene)-2, 5-selenophene and thiophene-(T)-TCNQ and selenophene-(Se)-TCNQ and tetracyano-quinoquinazolinoquinazoline (TCQQ) and hexamethylcyanotrimethylenecyclopropane (HMCTMCP) and 2,4-bis (dicyanomethylene)-1,3-dithietan (BDDT) and any of the TCNQ derivatives defined by the notation:

| | |
|---|---|
| TCNQ(OMe) | TCNQ IMe |
| TCNQ(OMe)$_2$ | TCNQI |
| TCNQ(OMe)(OEt) | TCNQ(OMe)(OCH$_3$)$_2$ |
| TCNQ(OMe)(O—i-Pr) | TCNQ(CN)$_2$ |
| TCNQ(OMe)(O—i-Bu) | TCNQ(Me) |
| TCNQ(O—i-C$_2$H$_5$) | TCNQ(Et) |
| TCNQ(OEt)(SMe) | TCNQ(i-Pr) |
| TCNQ Cl | TCNQ(i-Pr)$_2$. |
| TCNQ Br | |
| TCNQ ClMe | |
| TCNQ Br Me | |

33. The apparatus of claim 31, wherein each of said component electron acceptor moieties is a material selected from the group consisting of:
TCNQ (OMe)
TCNQ (OMe)$_2$
TCNQ(OMe)(OEt)
TCNQ Cl
TCNQ Br
TCNQ Cl Me
TCNQ Br Me
TCNQ I Me
TCNQ I
TCNQ (CN)$_2$
TCNQ (Me)
TCNQ (Et)
TCNQ (i-Pr).

34. The apparatus of claim 31, wherein said electron donor moiety is a metal selected from the group consisting of copper, silver, lead, nickel, lithium, sodium, potassium, barium, chromium, molybdenum, tungsten, cobalt, iron, antimony, cesium and magnesium and having chemical properties which permit formation of an organic salt when complexed with an organic electron acceptor.

35. The apparatus of claim 31, wherein said electron donor moiety is a metal and said metal is selected from the group consisting of silver and copper.

36. The apparatus of claim 31, wherein each of said component electron acceptor moieties is an organic material incorporating at least one cyanomethylene function group and having the chemical properties which permit formation of an organic salt when complexed with an electron donor moiety.

37. The apparatus of claim 31, wherein each of said component electron acceptor moieties is an organic material incorporating at least one quinolene unit and having the chemical properties which permit formation of an organic salt when complexed with an electron donor moiety.

38. The apparatus of claim 20, wherein said organic electron acceptor moiety is a derivative of the TCNE radical ion with inserted alkene groups.

39. The apparatus of claim 20, wherein said organic electron acceptor moiety is a derivative of the TCNE radical ion with inserted aromatic groups.

40. The apparatus of claim 20, wherein said organic electron acceptor moiety is 2,3-dichloro-5,6-dicyano-1,4-benzoquinone.

41. The apparatus of claim 20, wherein said organic electron acceptor moiety is p-chloranil.

42. The apparatus of claim 20, wherein said organic electron acceptor moiety is a two-stage radical ion in which the end groups form part of a cyclic pi-system with exhibited aromatic characteristics in the oxidized state.

43. The apparatus of claim 20, wherein said organic electron acceptor moiety is hexacyanotrimethylenecyclopropane diide.

44. The apparatus of claim 20, wherein said organic electron acceptor moiety is 2-dicyanomethylene-1,1,3,3, tetracyanopropanediide.

45. The apparatus of claim 20, wherein said organic electron acceptor moiety is composed of tetracyanoarenoquinodimethane with an extended pi-system.

46. The apparatus of claim 20, wherein said organic electron acceptor moiety is 1,3 squaric acid diamides.

47. The apparatus of claim 20, wherein said organic electron acceptor moiety is composed of dicyanomethylidene substituted with quinocyclopropenes.

48. An optically sensitive apparatus comprising:
a multistate optically sensitive organic charge transfer medium wherein the first state is a first oxidation state and is composed of at least one organic compound containing an organic electron donor moiety complexed with an electron acceptor moiety, said organic electron donor moiety having at least two structurally different regions, wherein each region has a different redox potential so as to switch from the first oxidation state to a second oxidation state in response to the application of electromagnetic energy at an optical frequency and at a field strength unique to said each of said regions, thus providing a different second state for each organic compound, and wherein the oxidation states of the first state and each second state have identifiably different optical spectra; and
a source of said electromagnetic energy.

49. The apparatus of claim 48, wherein the source of electromagnetic energy is one of a high intensity light source and a laser source.

50. The apparatus of claim 49, wherein said source of electromagnetic energy is a laser source illuminating at least one discrete area on said organic charge transfer medium.

51. The apparatus of claim 48, further comprising a means for varying the field strength of said source of electromagnetic energy at optical frequencies to a plurality of particular levels, each particular level unique to a particular one of said organic compounds for causing said organic electron acceptor moiety of a particular one of said organic compounds to switch from a first oxidation state to a second oxidation state.

52. The apparatus of claim 50, further comprising spectroscopic means focused on said at least one discrete area of said organic charge transfer medium for determining the oxidation state of each of said at least two organic compounds.

53. The apparatus of claim 52, wherein the particular oxidation state of each of said organic compounds has a unique Raman absorption spectra, and wherein said spectroscopic means utilizes such Raman adsorption spectra to identify the oxidation state of said at least one discrete area.

54. The apparatus of claim 48, further comprising a source of thermal energy for initiating a reverse reaction in said organic charge transfer medium for returning at least one of said organic compounds to the first oxidation state from the second oxidation state through the application of thermal energy.

55. The apparatus of claim 54, wherein the source thermal energy is a laser source.

56. The apparatus of claim 54, wherein said source of electromagnetic energy illuminates at least one discrete area on said organic charge transfer medium and further wherein said thermal energy is applied to the same at least one discrete area.

57. The apparatus of claim 48, further comprising a base material to support the charge transfer material and a transparent protective coating.

58. The apparatus of claim 48, wherein said organic electron donor moiety comprises at least two individual component electron donor moieties, each of said component electron donor moieties having a different redox potential and each of said component electron donor moieties joined together through covalent linkage.

59. The apparatus of claim 58, wherein said electron donor moiety is an organic material selected from the group consisting of tetrathioethylenes, dithiodiaminoethylenes, dithiodiselenoethylenes, tetraminoethylenes, arenes, aromatic hydrocarbons, and aromatic heterocyclics having chemical properties which permit formation of an organic salt when complexed with an electron acceptor moiety.

60. The apparatus of claim 48, wherein said electron donor moiety is a polycyclic compound having at least one region of conjugation and wherein at least one ring of said polycyclic compound contains a hetro-atom having at least one unshared pair of electrons.

61. The apparatus of claim 48, wherein said electron donor moiety is benzotrithiophene.

62. The apparatus of claim 48, wherein said electron donor moiety is a heteroarene with unabridged nitrogen atoms.

63. The apparatus of claim 48, wherein said electron donor moiety is a 4,4'-bypridium salt.

64. The apparatus of claim 48, wherein said electron donor moiety is 4,4'bithiopyran.

65. The apparatus of claim 48, wherein said electron donor moiety is 1,2-bis (thioxanthene-9-ylidene) ethene.

66. The apparatus of claim 48, wherein said electron donor moiety is a compound defined by the notation:

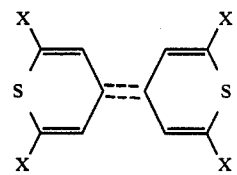

wherein X= substitute electron donor and/or electron acceptor.

67. The apparatus of claim 3, further comprising:
a means for directing a source of electromagnetic energy at optical frequencies to a selected one of a plurality of discrete areas on said charge transfer medium; and,
a means for varying the field strength of said source of electromagnetic energy at optical frequencies to a particular one of a plurality of levels, each one of said plurality of levels causes said area to switch to a particular state, each state being identifiable by a unique set of oxidation species.

68. The apparatus of claim 67, further comprising a means for directing the spectroscopic means to one of a plurality of the discrete areas, and wherein said spectroscopic means identifies the set of oxidation species present in said particular area, thereby determining the state of said area and identifying data stored in said area.

69. The apparatus of claim 68, wherein said spectroscopic means further comprises:
an optical read beam for illuminating said particular discrete area; and,
an optical means for collecting light reflected from said particular area and for measuring the spectral intensity at a plurality of preselected spectral bands.

70. The apparatus of claim 69, wherein said optical means measures the spectral intensity at a plurality of preselected Raman bands.

71. The apparatus of claim 68, wherein said spectroscopic means detects fluorescent emission from said particular discrete area.

72. The apparatus of claim 69, wherein said spectroscopic means further comprises detection circuit means for determining the switched state of said particular discrete area based on the pattern of spectral intensity in said preselected spectral bands.

73. The apparatus of claim 69, wherein said source of electromagnetic energy at optical frequencies and said optical read beam are a single illuminating beam adjustable to a plurality of intensity levels.

74. An optically sensitive apparatus comprising:
a multistate optically sensitive organic charge transfer medium wherein the first state is a first oxidation state and is composed of at least two different organic compounds, each of said organic compounds containing an electron donor moiety complexed with an organic electron acceptor moiety, wherein each of said organic compounds has a different redox potential so as to switch from the first oxidation state to a second oxidation state in response to the application of electromagnetic energy at an optical frequency and at a field strength unique to said each of said organic compounds, thus providing a different seconds state for each organic compound, wherein the oxidation states of the first state and each second state have identifiably different optical spectra, and further wherein the second oxidation state of one organic acceptor moiety exhibits fluorescence; and
a source of said electromagnetic energy.

75. The apparatus of claim 74, wherein the organic acceptor moiety exhibiting fluorescence is one of:
TCNQ(Ome)$_2$
TCNQ(O-i-Pr)(OMe)
TCNQ(i-Pr)$_2$.

* * * * *